United States Patent
Iacopi et al.

(10) Patent No.: US 8,431,924 B2
(45) Date of Patent: Apr. 30, 2013

(54) CONTROL OF TUNNELING JUNCTION IN A HETERO TUNNEL FIELD EFFECT TRANSISTOR

(75) Inventors: Francesca Iacopi, Leuven (BE); Anne S. Verhulst, Houtvenne (BE); Arturo Sibaja-Hernandez, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/558,184

(22) Filed: Jul. 25, 2012

(65) Prior Publication Data

US 2012/0298961 A1 Nov. 29, 2012

Related U.S. Application Data (62) Division of application No. 12/820,681, filed on Jun. 22, 2010, now Pat. No. 8,241,983.

(60) Provisional application No. 61/220,095, filed on Jun. 24, 2009.

(51) Int. Cl.
*H01L 29/06* (2006.01)
*H01L 31/072* (2006.01)
*H01L 31/109* (2006.01)
*H01L 31/0328* (2006.01)
*H01L 31/0336* (2006.01)

(52) U.S. Cl.
USPC ................ 257/27; 257/25; 438/285

(58) Field of Classification Search .......... 257/24, 257/25, 92, 27; 438/285
See application file for complete search history.

(56) References Cited

U.S. PATENT DOCUMENTS 4,994,868 A 2/1991 Geissberger et al.
(Continued)

FOREIGN PATENT DOCUMENTS

EP 08/09865 6/1997
EP 1 269 545 10/2001
(Continued)

OTHER PUBLICATIONS

Bhuwalka et al., IEEE transactions on electron devices vol. 52, No. 7, Jul. 2005.

(Continued)

*Primary Examiner* — Phuc Dang
(74) *Attorney, Agent, or Firm* — Knobbe Martens Olson & Bear LLP (57) ABSTRACT

A method to fabricate a hetero-junction in a Tunnel Field Effect Transistor device configuration (e.g. in a segmented nanowire TFET) is provided. A thin transition layer is inserted in between the source region and channel region such that the out-diffusion is within a very limited region of a few nm, guaranteeing extremely good doping abruptness thanks to the lower diffusion of the dopants in the transition layer. The transition layer avoids the direct contact between the highly doped source region and the lowly doped or undoped channel and allows to contain the whole doping entirely within the source region and transition layer. The thickness of the transition layer can be engineered such that the transition layer coincides with the steep transition step from the highly doped source region to the intrinsic region (channel), and hence maximizing the tunneling current.

20 Claims, 5 Drawing Sheets

U.S. PATENT DOCUMENTS

| | | |
|---|---|---|
| 6,362,065 B1 | 3/2002 | Swanson et al. |
| 6,706,542 B1 | 3/2004 | Geva et al. |
| 7,297,990 B1 | 11/2007 | Berger et al. |
| 8,026,509 B2 * | 9/2011 | Goel et al. .................. 257/24 |
| 2003/0129802 A1 | 7/2003 | Lanzerotti et al. |
| 2006/0194422 A1 | 8/2006 | Cardone et al. |
| 2006/0267108 A1 | 11/2006 | Patil |
| 2007/0148939 A1 | 6/2007 | Chu et al. |
| 2007/0187728 A1 | 8/2007 | Deleonibus |
| 2008/0308904 A1 | 12/2008 | Chidambaram et al. |

FOREIGN PATENT DOCUMENTS

| | | |
|---|---|---|
| WO | WO 97/23000 | 6/1997 |
| WO | WO 01/75978 | 10/2001 |
| WO | WO 2006/096464 A2 | 9/2006 |

OTHER PUBLICATIONS

Verhulst et al., J. Appl. Phys., 104(6):064514, 2008.

* cited by examiner

PRIOR ART

CONTROL OF TUNNELING JUNCTION IN A HETERO TUNNEL FIELD EFFECT TRANSISTOR

CROSS-REFERENCE TO RELATED APPLICATION

This application is a divisional of U.S. application Ser. No. 12/820,681 filed Jun. 22, 2010, now U.S. Pat. No. 8,241,983, which claims the benefit of U.S. Provisional Application No. 61/220,095, filed Jun. 24, 2009, the disclosures of which are hereby expressly incorporated by reference in their entirety and are hereby expressly made a portion of this application.

FIELD OF THE INVENTION

The present disclosure relates to the field of semiconductor devices and nanotechnology. More specifically, the disclosure relates to a nanostructure semiconductor device, more specifically to a tunnel field effect transistor having a segmented nanostructure (e.g. a heterostructure nanowire). Furthermore the disclosure relates to a method for manufacturing tunnel field effect transistor devices with integrated nanostructures such as nanowires having improved device properties.

BACKGROUND OF THE INVENTION

Microelectronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g. due to short channel effects) and because it becomes difficult to decrease the supply voltage. The latter is mainly due to the fact that the subthreshold slope is limited to minimally about 60 mV/decade, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the subthreshold slope can be less than 60 mV/dec, the physical limit of conventional MOSFETs, such that potentially lower supply voltages can be used. However, TFETs typically suffer from low on-currents, a drawback related to the large resistance of the tunnel barrier.

To increase the on-current of a silicon TFET, suggestions have been made in literature by Bhuwalka et al. (IEEE transactions on electron devices Vol. 52, No 7, July 2005) to add a small (about 3 nm wide) section of highly-doped $Si_{(1-x)}Ge_x$ at the tunnel barrier. The $Si_{(1-x)}Ge_x$ has a smaller band gap than Si such that the effective tunnel barrier width decreases due to the presence of this section. However, these structures with the $Si_{(1-x)}Ge_x$ section can still not compete with conventional MOSFETs because of their low on-currents.

Figure 1:
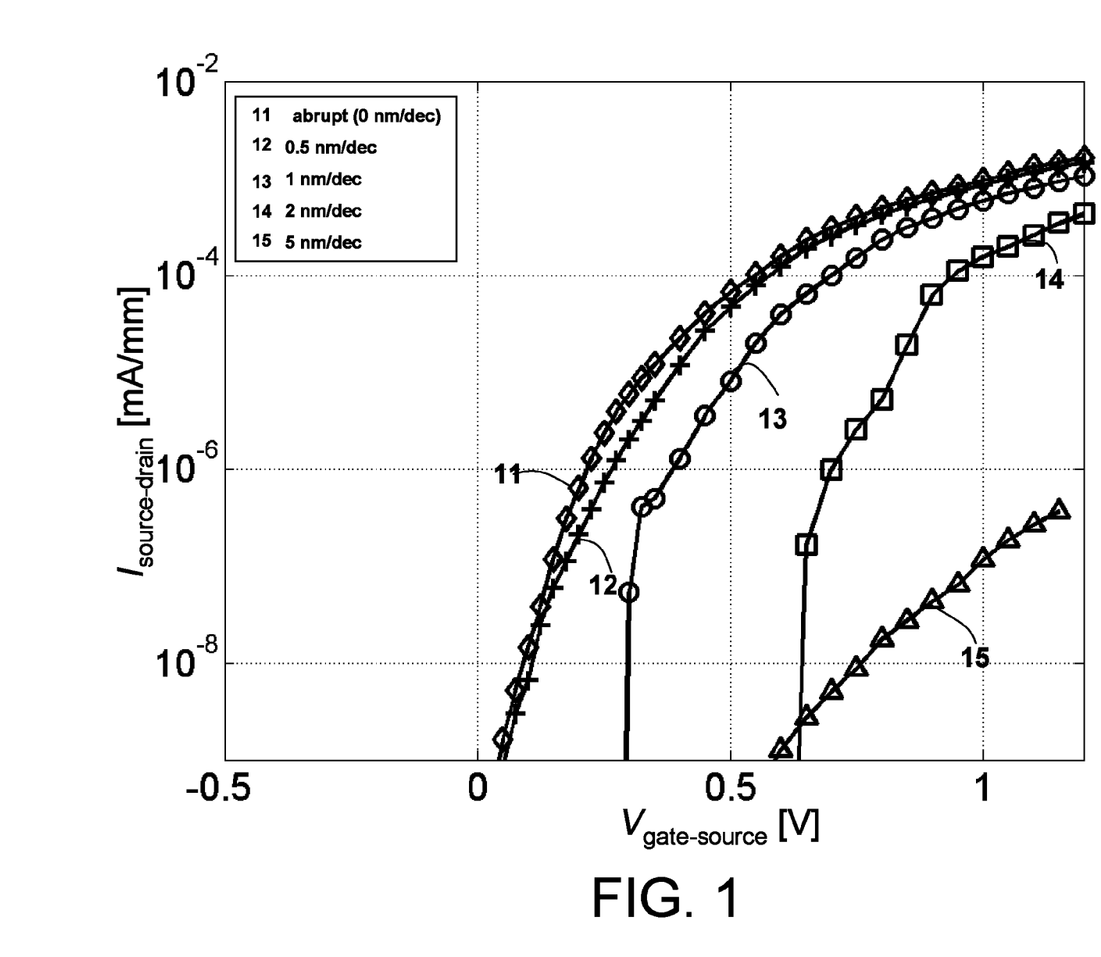
FIG. 1 illustrates that the increase in ON current strongly depends on the abruptness of the (p) doping profile at the (Si)Ge/intrinsic Si tunneling junction. The legend illustrates the required thickness (nm) needed to reduce the dopant concentration by one decade in a Ge-source Si-channel TFET (whereby the doping gradient is illustrated within the Si channel). The curve with the highest ON-current is the curve with the most abrupt doping profile.

Verhulst et al. [A. S. Verhulst et al, J. Appl. Phys., 104(6): 064514, 2008] have shown that the ON current of a tunnel field-effect transistor can be boosted by using a p-doped Ge (or p-doped SiGe) source in combination with a Si channel and n doped drain. However, the increase in ON current depends strongly on the abruptness of the (p) doping profile at the (Si)Ge/intrinsic Si tunneling junction (see FIG. 1). This is a challenging task to achieve, as the p-type dopants (e.g. B dopants) readily diffuse into the Si channel due to the thermal budget during the device fabrication.

SUMMARY OF THE INVENTION

It is an object of particular embodiments of the present disclosure to provide a method for achieving a tunnel Field Effect transistor (TFET) with a heterojunction thereby eliminating or at least reducing drastically the out-diffusion of the dopants of the source into the (intrinsic) channel region.

It is another object of the present disclosure to provide a TFET with good properties, in particular for example a TFET with a high-quality heterojunction.

The problem to be solved is avoiding out-diffusion of the dopants from the doped source towards the channel region such that a steep dopant profile is achieved at the interface of the source and channel. The problem of out diffusion especially occurs in heterostructures where the dopant of the source has lower diffusion kinetics in the channel material than in the source material. Since the doped source is in direct contact with the intrinsic channel, a source made of Ge (or SiGe) having dopants such as B which have higher diffusivity in Si compared to Ge (or SiGe) will always diffuse towards the Si channel, especially due to the thermal budget during fabrication of the TFET.

The above objectives are accomplished by a method and a device according to embodiments of the present disclosure.

Particular and preferred aspects of the disclosure are set out in the accompanying independent and dependent claims. Features from the dependent claims may be combined with features of the independent claims and with features of other independent claims as appropriate and not merely as explicitly set out in the claims.

In a first aspect, embodiments of the present disclosure disclose a method for providing a tunnel field effect transistor (TFET) comprising at least a source region and a channel region, with a heterojunction between the source and the channel region, thereby eliminating or at least reducing drastically the out-diffusion of the dopants of the source into the (intrinsic) channel region. The method comprises at least the steps of:

Providing a substrate,

Providing onto the substrate a drain region made of a drain semiconductor material having a high doping level of e.g. $10^{18}$ $cm^{-3}$ or higher, Providing a channel region made of a channel semiconductor material onto the drain region, the channel region being lowly doped, e.g. having a doping level below $10^{17}$ $cm^{-3}$, or undoped, Providing a source region made of a source semiconductor material onto the channel region, and Doping the source region and the drain region.

The method is characterized in that, before providing the source region, a transition layer is provided made of a material which is al least partly identical in components to the source semiconductor material and at least partly different in components from the channel semiconductor material and which has lower diffusion kinetics for the dopant than the channel material. In particular embodiments, the transition layer material is the same as the source material.

A method according to embodiments the present disclosure has the advantage that the thickness of the transition layer can be engineered such that the transition layer coincides with a steep transition step from the doped source region to the lowly doped or undoped channel region, thereby maximizing the tunneling current.

According to particular embodiments of the disclosure, doping the source region and the drain region comprises selectively doping the as-deposited source and drain regions to a desired doping level with a desired dopant type, for example $10^{18}$/cc to $10^{21}$/cc, to form a highly doped source and drain region, for example the doping level of the source region and/or the drain region may be in the range of $10^{19}$/cc to $5 \times 10^{20}$/cc. The dopant elements used for doping may be p-type dopants or alternatively n-type dopants. According to alternative embodiments, source and drain semiconductor material may be in situ doped during deposition.

According to particular embodiments of the disclosure the semiconductor materials used in the TFET may be selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof.

According to particular embodiments of the disclosure the source semiconductor material may be germanium or $Si_{(1-x)}Ge_x$ with x>0.15.

According to particular embodiments of the disclosure the channel semiconductor material may be silicon.

According to particular embodiments of the disclosure the transition layer is made of the source semiconductor material or a combination of the source and the channel semiconductor material. Dopants of the source region have higher diffusivity in the channel semiconductor material (e.g. Si) compared to their diffusivity in the source semiconductor material (e.g. Ge or SiGe).

The sequence of the drain region, the channel region and the source region may lay in a longitudinal direction of the TFET. According to particular embodiments, the method for providing a tunnel field effect transistor (TFET) with a heterojunction may further comprise the steps of providing along the source-channel-drain regions a gate dielectric and a gate electrode, the gate dielectric covering along the longitudinal direction at least part of the source-channel-drain regions and the gate electrode being situated onto the gate dielectric, not extending beyond the gate dielectric, and the step of forming at least one source contact on the at least one source region.

In alternative embodiments, a method according to embodiments of the present disclosure may comprise:
  providing a substrate with at least one drain contact
  providing on the drain contact a source-channel-drain structure made of at least two different semiconductor materials, the structure having at least one doped drain region, made of a first semiconductor material, at least one intrinsic channel region made of the first semiconductor material, and at least one highly doped source region made of a second semiconductor material different from the first semiconductor material, there being a source-channel interface and a drain-channel interface, the source-channel-drain structure having a longitudinal direction,
  providing a transition layer made of the second semiconductor material or a combination of the first and the second semiconductor material which is situated at the source-channel interface,
  providing on the source-channel-drain structure a gate dielectric, e.g. an oxide, and a gate electrode, the gate dielectric covering along the longitudinal direction at least part of the source-channel-drain structure and the gate electrode being situated on the gate dielectric, not extending beyond the gate dielectric, and
  forming at least one source contact on the at least one source region.

According to particular embodiments, the source and drain regions are selectively doped to a desired doping level with a desired dopant type.

According to particular embodiments, the gate dielectric and gate electrode form the gate structure and cover the source-channel-drain structure along the longitudinal direction thereof and extend at least up to the plane of the source-channel interface.

According to particular embodiments, the first semiconductor material is selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. For example, the first semiconductor material may be silicon.

According to particular embodiments, the second semiconductor material is selected from at least one of the group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. For example, the second semiconductor material may be germanium or $Si_{(1-x)}Ge_x$ with x>0.15.

According to particular embodiments, the transition layer may be made of the second semiconductor material or a combination of the first and the second semiconductor material and wherein the dopants of the source region, such as e.g. B, have higher diffusivity in the first semiconductor material (e.g. Si) compared to their diffusivity in the second semiconductor material (e.g. Ge or SiGe).

According to particular embodiments, the gate dielectric is selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. More particular the gate oxide may be a high-k oxide such as hafnium oxide.

According to particular embodiments, the gate electrode (contact) is made of a conductive material and is selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. More particular the gate contact may be made of a metal of which the workfunction has been engineered specifically for the chosen TFET material (first and second semiconductor material).

According to particular embodiments, the source and drain contacts may be made from a conductive material which is selected from at least one of a silicide containing structure (NiSi, $CoSi_2$, $TiSi_2$, ...), a germanide containing structure, a metal containing structure, poly silicon or a combination thereof. More particularly the source and drain may be a combination of a metal with a silicide.

In a second aspect of the present disclosure, a heterostructure Tunnel Field Effect transistor (TFET) with a heterojunction is disclosed, which eliminates or at least drastically reduces the out-diffusion of the dopants of the source into the (intrinsic) channel region.

In embodiments of this second aspect, a tunnel field effect transistor (TFET) is provided. The TFET is a segmented hetero-TFET made of at least following segments (regions):
- A highly doped drain region made of a drain semiconductor material, e.g. with a doping level of $10^{18}$ cm$^{-3}$ or higher,
- A channel region made of a lowly doped, e.g. doped at a doping level below $10^{17}$ cm$^{-3}$, or undoped channel semiconductor material situated onto the drain region, and
- A doped source region made of a source semiconductor material onto the channel region.

The TFET is characterized in that a transition layer made of a material which is at least partly identical in components to the source semiconductor material and at least partly different in components from the channel semiconductor material, is situated in between the channel region and the doped source.

The TFET according to embodiments of the present disclosure may be a vertical device configuration and the vertical device may be of a nanostructure made of different segments (e.g. a segmented nanowire) wherein the segments form the source, channel and drain region of the TFET.

According to particular embodiments a heterostructure TFET is disclosed in which at least the source and the channel of the TFET structure are made of different semiconducting materials. The disclosure has surprising benefits if the source of the TFET is made of a semiconductor material which is highly doped and the channel is made of another lowly doped, e.g. having a doping level below $10^{17}$ cm$^{-3}$, or undoped semiconductor material and wherein a transition layer is placed in between the highly doped source and lowly doped or undoped channel. According to particular embodiments, significant surprising benefits are obtained if the source of the TFET is made of a Ge or SiGe semiconductor material which is highly doped, e.g. a highly doped Ge or SiGe with a Ge content higher than 15%, the channel is made of lowly doped, e.g. having a doping level below $10^{17}$ cm$^{-3}$, or undoped Si semiconductor material and a Ge or SiGe transition layer is placed in between the highly doped source and lowly doped or undoped Si channel. The effect is most pronounced when the transition layer has higher Ge content (%). The effect of obtaining a steep doping profile is most pronounced if both a Ge source and Ge transition layer are used, such that the difference in dopant diffusivity with the Si channel is the largest. So also if a SiGe transition layer is used with a Ge source, the effect will be stronger if there is a higher Ge content in the transition layer. But also if a SiGe source and SiGe transition layer are used, the higher the Ge content the steeper the doping profile. Hence, in embodiments of the present disclosure it is especially the Ge content of the transition layer that matters. Alternatively, devices with a SiGe source, a Ge transition layer and a Si channel also result in a valuable device.

Hence, in accordance with embodiments of the present disclosure, the problem of out-diffusion is solved by insertion of a transition layer in between the intrinsic channel and the doped source. The transition layer has a thickness of a few nm only, for example between 1 and 10 nm, depending on the choice of material for source region and channel region. A good choice is a thickness between 2 nm and 5 nm for a transition layer made of SiGe with 15% Ge. The transition layer can contain the out-diffusion of dopants within a very limited region of a few nm, e.g. 1 to 10 nm, thus guaranteeing extremely good doping abruptness thanks to the lower diffusion of the dopants in the transition layer.

According to particular embodiments of the present disclosure, the insertion of a transition layer between the source and the channel avoids the direct contact between the doped source and the intrinsic channel and allows preserving all of the dopants (e.g. B atoms) entirely within the source and transition layer.

According to particular embodiments of the present disclosure, the insertion of a transition layer in a heterostructure TFET has the purpose of achieving an abrupt source-channel interface and to engineer the doping profile to coincide with the hetero-interface.

According to particular embodiments of the disclosure, the segmented hetero-TFET is a vertical nanostructure, e.g. a nanowire wherein the different segments represent the source, channel and drain regions of the TFET.

According to particular embodiments of the disclosure, the source and drain regions in the segmented hetero-TFET are selectively doped to a desired doping level with a desired dopant type, for example the source and drain regions may be selectively doped to a dopant concentration of $10^{18}$/cc to $10^{21}$/cc to form a highly doped source and drain region.

According to particular embodiments of the disclosure, the semiconductor material of the hetero-TFET is selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof.

According to particular embodiments of the disclosure, the source semiconductor material of the hetero-TFET is made of germanium or Si$_{(1-x)}$Ge$_x$ with x>0.15.

According to particular embodiments of the disclosure, the channel semiconductor material of the hetero-TFET is made of silicon.

According to particular embodiments of the disclosure, the transition layer of the hetero-TFET is made of the source semiconductor material or a combination of the source and the channel semiconductor material and wherein the dopants of the source have higher diffusivity in the channel semiconductor material (e.g. Si) compared to its diffusivity in the source semiconductor material (e.g. Ge or SiGe).

According to particular embodiments, the TFET is a heterostructure TFET in which the source is made of highly doped Ge or SiGe with a p-type dopant selected from B, P, or the like, and the intrinsic channel is made of Si. The problem of out-diffusion of the p-type dopant towards the channel region is avoided by incorporation of a Ge or SiGe layer in between the source and channel region. Because the diffusion of p-type dopants such as B is much lower in Ge than in Si, the transition layer will act as a buffer layer. The thickness of the transition layer needs to be selected such that further diffusion of the dopant into the channel is eliminated.

According to particular embodiments of the disclosure, the hetero-TFET comprises along the source-channel-drain regions a gate dielectric and a gate electrode. The sequence of the drain region, the channel region and the source region may lay in a longitudinal direction of the TFET. The gate dielectric covers along the longitudinal direction at least part of the source-channel-drain regions and the gate electrode is situated onto the gate dielectric, not extending beyond the gate dielectric. The TFET may furthermore comprise at least one source contact on the at least one source region.

According to an alternative embodiment of the first or second aspect of the present disclosure, Carbon atoms may be added to the transition layer (or in other words added to the second semiconductor material or the combination of first and second semiconductor material) to further retard the out-diffusion of the dopants from the source region and further avoid diffusion of the dopants into the channel region. Furthermore the addition of carbon may reduce the compressive stress of the second semiconductor material on the first semiconductor material, e.g. the compressive stress of Ge on Si. The addition of Carbon atoms (also referred to as carbon doping) is such that a concentration of 0 up to a maximum of 3% carbon in the transition layer is achieved, for example not more than 2%.

Furthermore a method for manufacturing a nanostructure (e.g. nanowire) TFET semiconductor device according to particular embodiments of the disclosure is disclosed. The method comprises the steps of:

providing on a substrate at least one drain contact onto which optionally a catalyst is deposited, growing a nanostructure, e.g. a nanowire, onto the substrate made of at least a first and a second semiconductor material, the nanostructure having an integrated drain region made of a first semiconductor material, an channel region made of the first semiconductor material, and a source region made of a second semiconductor material to form a TEFT structure, there being a source-channel interface and a drain-channel interface and, doping (selectively) the source region and drain region to a desired doping level and dopant type, depositing on at least part of the side walls of the nanostructure a gate dielectric (e.g. oxide), depositing on top of the gate dielectric (e.g. oxide) a gate electrode, the gate electrode being situated on the gate dielectric so as to not extend beyond the gate dielectric, forming a source contact at the source region of the nanostructure.

The manufacturing method is characterized in that a transition layer made of the first semiconductor material or a combination of the first and the second semiconductor material is formed at the source-channel interface.

With the term "nanostructure" is meant any two-dimensionally confined pieces of solid material in the form of wires (nanowires), tubes (nanotubes), rods (nanorods) and similar elongated substantially cylindrical or polygonal nanostructures having a longitudinal axis. A cross-dimension of the elongated nanostructures preferably lies in the range of 1 nm to 500 nm, in the range of 3 nm to 300 nm, or below 100 nm.

According to particular embodiments of the present disclosure, the step of selectively doping the source region and drain region may be performed during the step of growing the nanostructure (nanowire) TFET.

In a particular embodiment the doping level of the source region and drain region may be in the range of $10^{18}$/cc to $10^{21}$/cc to form a highly doped source and drain region, for example the doping level of the source region and drain region may be in the range of $10^{19}$/cc to $5\times10^{20}$/cc.

According to particular embodiments, the TFET device may be made of a nanostructure e.g. a nanowire wherein the nanostructure forms the channel and potentially also the source and drain regions of the TFET. Alternatively, either the source or drain regions of the TFET are situated in the substrate whereby the substrate comprises highly doped regions acting as source and drain regions.

According to particular embodiments, the diameter of the nanostructure (nanowire) TFET is between 1 and 500 nm and a length between 5 nm and 10 μm, for example a diameter between 2 nm and 200 nm and a length between 10 nm and 5 μm, e.g. between 10 nm and 1 μm.

According to particular embodiments, the length of the channel region (referred to as $L_{channel}$) is in the range of 5 nm to 10 μm, for example in the range of 10 nm to 5 μm.

According to particular embodiments, the length of the transition layer is in the range of 1 nm to 10 nm, for example in the range of 2 nm to 5 nm. The optimal thickness of the transition layer depends on the composition of the transition layer and the thermal budget used during processing (influencing the mobility/diffusivity of the dopants). For example a good transition layer thickness for a SiGe (15% Ge) transition layer and thereby using a thermal budget during growth of around 750° C. is in the range of 2 nm to 5 nm.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure, the scope of the disclosure being limited only by the claims. The reference figures quoted below refer to the attached drawings.

BRIEF DESCRIPTION OF THE DRAWINGS

All figures are intended to illustrate some aspects and particular embodiments of the present disclosure. The figures are depicted in a simplified way for reason of clarity. Not all alternatives and options are shown and therefore the disclosure is not limited to the content of the given drawings. Like numerals are employed to reference like parts in the different figures.

DETAILED DESCRIPTION OF THE PREFERRED EMBODIMENT

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Moreover, the term top and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary particular embodiments, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that particular embodiments may be practiced without these specific details. In other instances, well-known methods, structures and techniques have not been shown in detail in order not to obscure an understanding of this description.

The disclosure will now be described by a detailed description of several particular embodiments. It is clear that other particular embodiments can be configured according to the knowledge of persons skilled in the art without departing from the technical teaching of the disclosure as defined by the appended claims.

Particular embodiments of the present disclosure provide a method to fabricate a hetero-junction in a Tunnel Field Effect Transistor (TFET) device configuration (e.g. in a segmented nanowire TFET). In prior art devices, since the highly doped source is in direct contact with the undoped channel, some amount of dopants will diffuse from the source into the channel, and this cannot be avoided due to the source deposition thermal budget. This out-diffusion reduces the steepness of the doping profile and hence deteriorates the device operation.

Particular embodiments of the present disclosure comprise the insertion of a transition layer with a thickness of only a few nm in between the source and channel region such that the out-diffusion occurs within a very limited region of a few nm, not more than the thickness of the transition layer. The material of the transition layer is selected such that it has lower diffusion kinetics for the source dopants than the channel material, thus guaranteeing extremely good doping abruptness thanks to the lower diffusion of the dopants in the transition layer. The transition layer avoids the direct contact between the highly doped (e.g. Ge or SiGe) source and the undoped (e.g. Si) channel and allows to contain the whole doping (e.g. B atoms) entirely within the source region and transition layer. The thickness of the transition layer can be engineered such that the transition layer coincides with the steep transition step from the highly doped source region to the intrinsic region (channel), hence maximizing the tunneling current.

At least some of the embodiments of the present disclosure relate to the creation of semiconductor devices and more specifically to the creation of a Tunnel-Field Effect Transistor, for example a nanostructure TFET (e.g. a Nanowire-TFET (NW-TFET)) on a semiconductor substrate. A heterostructure TFET (e.g. NW-TFET) is disclosed whereby the TFET is made of at least a first and second semiconductor material which comprises a drain region (section) made of a first semiconductor material or a second semiconductor material having a first doping level of at least $10^{18}$ cm$^{-3}$ and first doping composition, a lowly doped, e.g. having a doping level below $10^{17}$ cm$^{-3}$, or undoped channel region made of the first semiconductor material and a source region (section) made of the second semiconductor material having a second doping level and second doping composition. In particular embodiments, a p-doped section is situated at the one end of the TFET (NW-TFET), e.g. forming the source, and an n-doped section is situated in the other end of the TFET (NW-TFET), e.g. forming the drain.

The TFET (NW-TFET) of embodiments of the present disclosure differs from all other state of the art TFET (NW-TFET) devices in the fact that a thin transition layer is situated at the interface of the highly doped source region, e.g. having a doping level of at least $10^{18}$ cm$^{-3}$, and lowly doped, e.g. having a doping level below $10^{17}$ cm$^{-3}$, or undoped channel region, the transition layer having a thickness of not more than 10 nm, wherein the transition layer is made of a material which is at least partly identical to the source semiconductor material and at least partly different from the channel semiconductor material and which has lower diffusion kinetics for the dopant than the channel material.

The resulting TFET (NW-TFET) according to embodiments of the present disclosure has an improved performance, more specifically an improved tunneling efficiency compared to similar state of the art TFET devices without a transition layer. This is because the TFET according to embodiments of the present disclosure has a much sharper (steeper) doping profile and because of the coincidence of the heterojunction with the sharp doping transition (achieving a well-defined tunneling location).

The TFET (NW-TFET) of some embodiments of the disclosure can further be characterized as a TFET having at least one nanostructure (nanowire). The nanostructure comprises the source region, channel region and drain region of the TFET device as well as the novel transition layer according to embodiments of the present disclosure, being situated at the interface between the source and channel region. More specifically, in embodiments of the present disclosure the transition layer is situated in between the source region and the channel region of the nanostructure. The purpose of the transition layer is to get a well-defined tunneling region after the full fabrication process of the TFET.

The nanostructure (nanowire) in the TFET of some embodiments of the present disclosure can be characterized as a semiconducting nanowire wherein the diameter of the nanowire is between 1 and 500 nm and the length of the nanowire is between 5 nm and 2 µm. In particular embodiments, the diameter of the nanowire may be between 2 nm and 200 nm and the length of the nanowire may be between 10 nm and 1 µm.

Figure 2A:
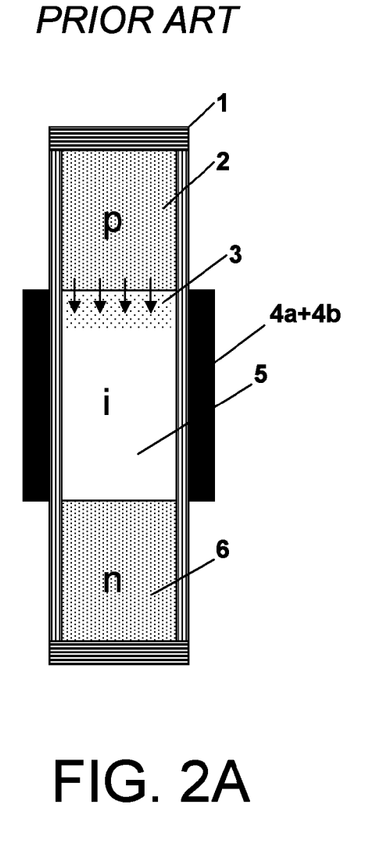
FIG. 2A illustrates a state of the art TFET (NW-TFET) without a transition layer in between the source and channel region such that the dopants of the highly doped source region diffuse into the channel region leading to bad device characteristics.
Figure 2B:
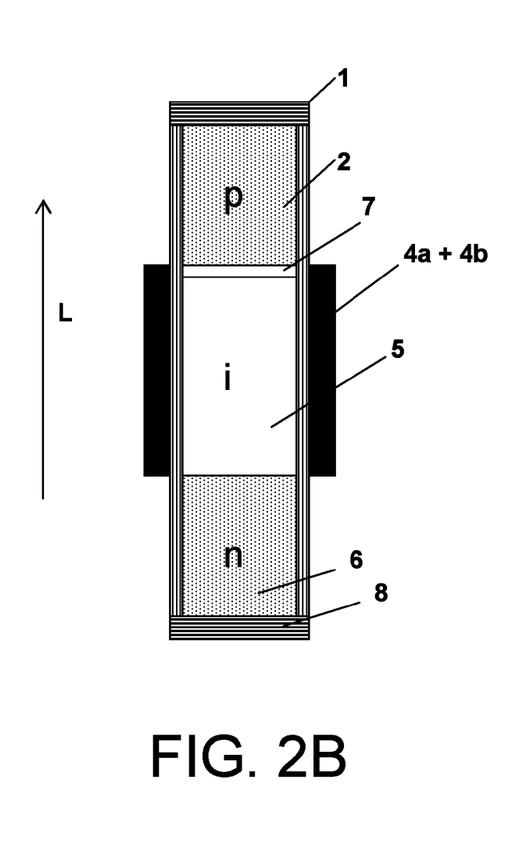
FIG. 2B illustrates the TFET (NW-TFET) according to particular embodiments of the disclosure whereby a transition layer is present in between the source and channel region such that the dopants of the highly doped source region cannot or not substantially diffuse into the channel region leading towards significantly improved device characteristics.

FIG. 2A illustrates a cross-section of a state of the art TFET (NW-TFET) without a transition layer in between the source 2 and channel 5 region such that the dopants 3 of the highly doped source 2 region diffuse into the channel 5 region leading towards bad device characteristics. FIG. 2B illustrates the TFET (NW-TFET) according to particular embodiments of the disclosure whereby a transition layer 7 is present in between the source 2 and channel 5 region such that the dopants of the highly doped source region 2 cannot diffuse into the channel region 5 leading towards significantly improved device characteristics.

According to particular embodiments as illustrated in FIG. 2B, a TFET according to embodiments of the disclosure is made of a segmented hetero-TFET made of at least a doped drain region 6 made of a drain semiconductor material, e.g. having a doping level of at least $10^{18}$ cm$^{-3}$, a lowly doped, e.g. having a doping level below $10^{17}$ cm$^{-3}$ or undoped channel region 5 made of a channel semiconductor material situated onto the drain region 6, a doped source region 2 made of a source semiconductor material onto the channel region 5 and further comprising a transition layer 7 made of a material which is at least partly identical to the source semiconductor material and at least partly different from the channel semiconductor material and which is situated in between the channel region 5 and the doped source region 2.

According to particular embodiments of the disclosure, the segmented hetero-TFET is a vertical nanostructure e.g. a nanowire wherein the different segments represent the source, channel and drain regions of the TFET.

According to particular embodiments of the disclosure, the source 2 and drain 6 regions in the segmented hetero-TFET are selectively doped to a predetermined, desired, doping level with a predetermined, desired, dopant type, for example the source and drain regions are selectively doped to a dopant concentration of $10^{18}$/cc to $10^{21}$/cc to form a highly doped source region 2 and drain region 6.

According to particular embodiments of the disclosure, the semiconductor materials used in the hetero-TFET are selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof.

According to particular embodiments of the disclosure, the source semiconductor material of the hetero-TFET may be germanium or Si$_{(1-x)}$Ge$_x$ with x>0.15.

According to particular embodiments of the disclosure, the channel semiconductor material of the hetero-TFET may be silicon.

According to particular embodiments of the disclosure, the transition layer 7 of the hetero-TFET is made of the source semiconductor material or a combination of the source and the channel semiconductor material. The transition layer 7 material is selected such that the dopants of the source 2 have higher diffusivity in the channel semiconductor material 5 (e.g. Si) compared to their diffusivity in the source semiconductor material 2 (e.g. Ge or SiGe).

According to particular embodiments of the disclosure, the hetero-TFET comprises along the source-channel-drain regions 2, 5, 6 a gate dielectric 4a and a gate electrode 4b, the gate dielectric 4a covering along the longitudinal direction L of the TFET at least part of the source-channel-drain regions 2, 5, 6 and the gate electrode 4b being situated onto the gate dielectric 4a, not extending beyond the gate dielectric 4a. The source region 2 may furthermore comprise at least one source contact 1.

Figure 3A:
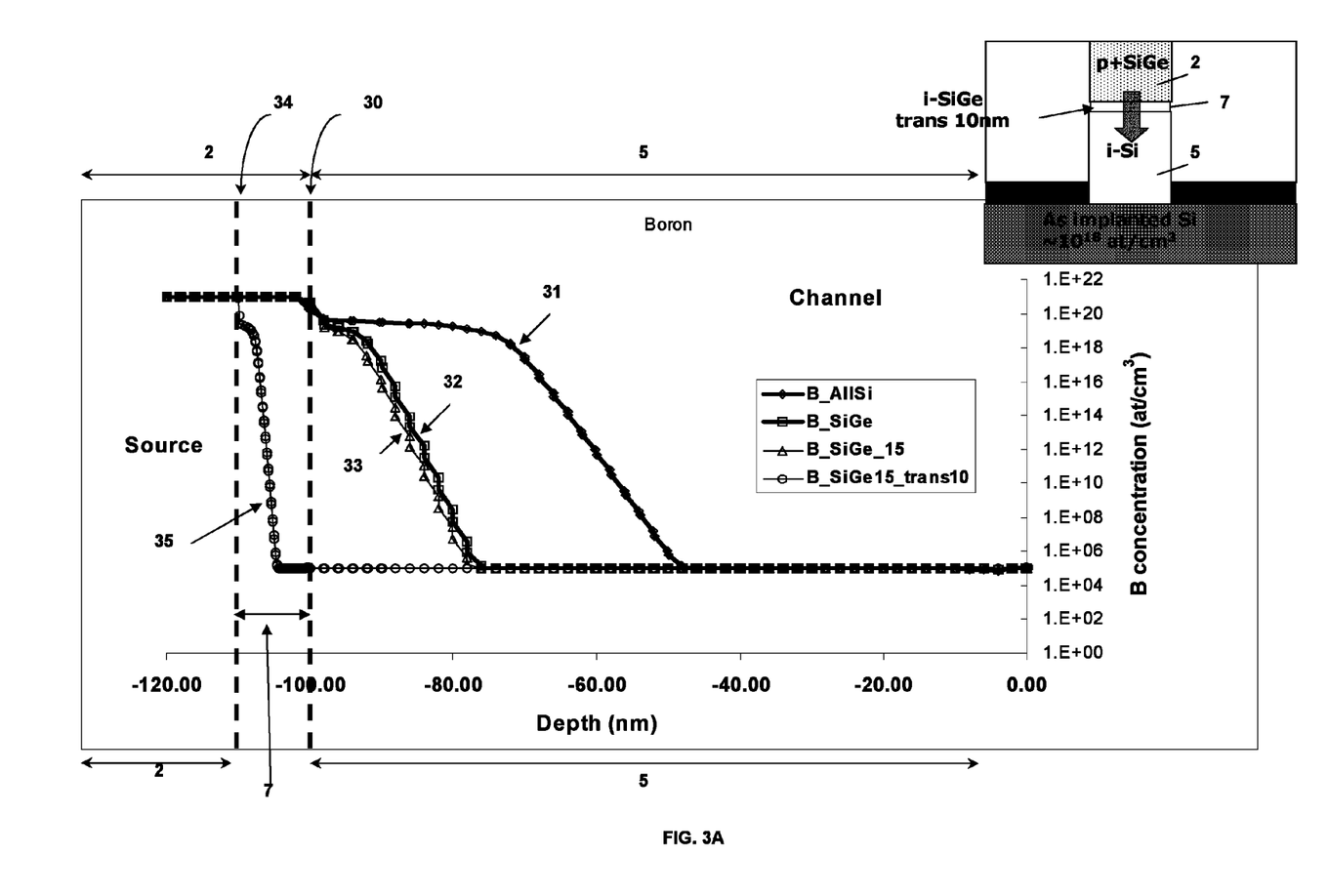
FIG. 3A illustrates the evolution of the Boron out-diffusion from the B-doped source towards the intrinsic channel with and without the presence of a transition layer in accordance with embodiments of the present disclosure, upon high T activation step (900° C.). The transition layer used is a 10 nm undoped SiGe layer.
Figure 3B:
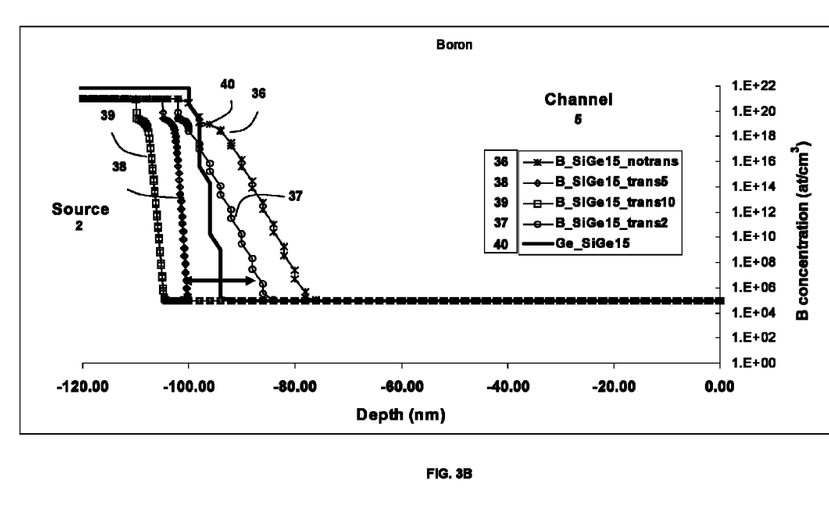
FIG. 3B shows a graph illustrating the Boron out-diffusion for different transition layer thicknesses for SiGe (15% Ge) undergoing a thermal budget of growth at 750° C.

FIGS. 3A and 3B illustrate the evolution of B dopants (out-diffusion) from the source region 2 into the channel region 5 upon using a thermal budget of e.g. 350° C. for a TFET with and without transition layer 7 in accordance with embodiments of the present disclosure. The thermal budget was applied to increase diffusion of the dopants (Boron), it is clear that the transition layer eliminates or at least drastically reduces the diffusion of the Boron dopants into the channel region 5.

It can be seen from FIG. 3A that, if the p+ doped source region 2 has a direct interface with the channel region 5, as illustrated by interface line 30, the source dopants out-diffuse into the channel region 5. Different situations are illustrated in FIG. 3A: graph 31 illustrates the dopant concentration in case a Boron doped Si source region 2 is in direct contact with an intrinsic Si channel region 5; graph 32 illustrates the dopant concentration in case a Boron doped SiGe source region 2 is in direct contact with an intrinsic Si channel region 5; graph 33 illustrates the dopant concentration in case a Boron doped Si$_{0.85}$Ge$_{0.15}$ source region 2 is in direct contact with an intrinsic Si channel region 5.

Another situation illustrated in FIG. 3A is an embodiment of the present disclosure, where a Si$_{0.85}$Ge$_{0.15}$ source region 2 ends at the location indicated by line 34. Between the source region 2 and the intrinsic Si channel region 5 a 10 nm thick undoped SiGe transition layer 7 is provided. It can be seen from graph 35 that the doping concentration has a steep profile in the transition layer 7. The profile illustrated in graph 35 shows a decay of about 16 decades over about 6 nm of the transition layer 7.

FIG. 3B illustrates different dopant concentration graphs in function of transition layer 7 thickness. The B_SiGE . . . curves illustrate the B-concentration (=doping concentration) with respect to position. The Ge_SiGe curve 40 shows the Ge concentration with respect to position. In this way, the doping profile can be seen with respect to the material change. Graph 36 illustrates the dopant concentration for a Boron doped Si$_{0.85}$Ge$_{0.15}$ source region 2 in case no transition layer 7 is present; graph 37 illustrates the dopant concentration for a Boron doped Si$_{0.85}$Ge$_{0.15}$ source region 2 with a 2 nm thick transition layer 7; graph 38 illustrates the dopant concentration for a Boron doped $Si_{0.85}Ge_{0.15}$ source region 2 with a 5 nm thick transition layer 7; and graph 39 illustrates the dopant concentration for a Boron doped $Si_{0.85}Ge_{0.15}$ source region 2 with a 10 nm thick transition layer 7. All the above graphs 36, 37, 38, 39 are measured at a thermal budget of growth of 750° C. It can be seen that the steepness of the graphs 38 and 39 is substantially the same, hence for this embodiment transition layer 7 thicknesses between 2 nm and 5 nm are optimal. This result is specific for SiGe with 15% Ge. If full Ge is used, thicknesses between 2 nm and 10 nm, for example between 5 nm and 10 nm may be optimal.

Figure 4:
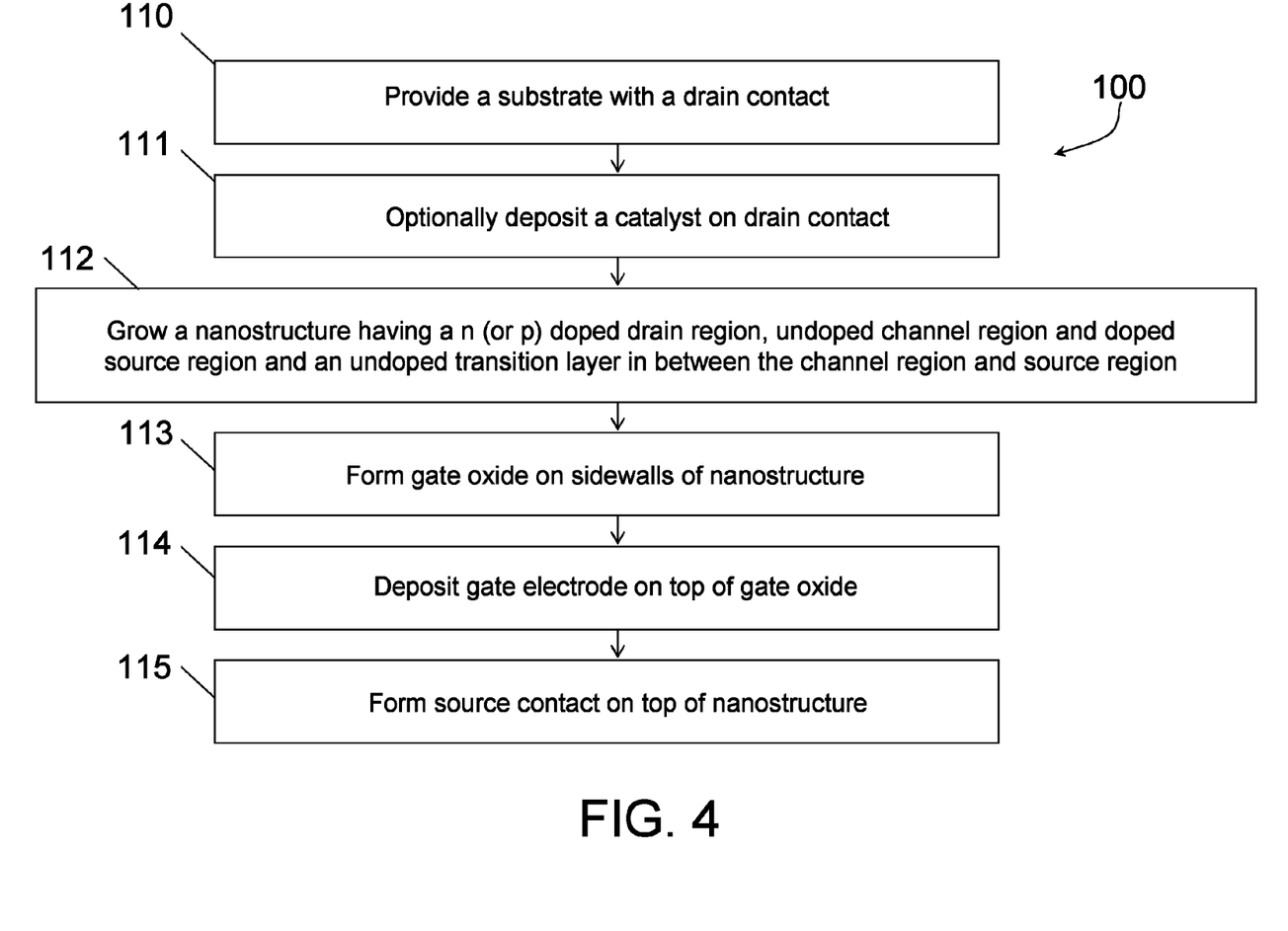
FIG. 4 illustrates a flow diagram of a particular method for fabricating a TFET (NW-TFET) according to embodiments of the present disclosure.

A processing method according to embodiments of the present disclosure is schematically illustrated in a flowchart 100 shown in FIG. 4 and will be described in detail below. The embodiment illustrated is for a nanostructure, e.g. nanowire TFET. It has, however, to be understood that this is only an example of a suitable method for forming a device according to embodiments of the present disclosure. The description of this particular embodiment is not intended to limit the present disclosure to the sequence of the process steps as described hereinafter.

In a first step 110, a substrate is provided (not illustrated in the drawings). For example the substrate may be a semiconductor substrate such as a silicon substrate or a silicon on insulator (SOI) substrate but any other suitable substrate can be used as well such as, for example, glass, ceramics, etc. According to an embodiment of the disclosure, in the substrate or alternatively on top of the substrate, a drain contact 8 is created. The drain contact 8 may be made of a conductive material, e.g. the drain contact 8, may be a silicide containing structure (NiSi, $CoSi_2$, $TiSi_2$, or the like), a germanide containing structure, a metal containing structure, polysilicon or a combination thereof. Also disclosed are drain contacts 8 formed of e.g. conductive oxides and even conductive polymers. In case the drain contact 8 is a metal containing structure, all metals which form an ohmic contact with the material of a nanostructure, e.g. nanowire to be formed later on, should have a comparable work function with respect to the work function of the material of the nanostructure, e.g. nanowire. As an example only, the drain contact 8 may be a silicide containing structure. The drain contact 8, can be the starting point for growing the nanostructure, e.g. nanowire and can, at the same time, act as the catalyst for the nanostructure, e.g. nanowire growth. However, the latter is not necessarily essential.

In case the drain contact 8 cannot be used as a catalyst for the subsequent nanostructure, e.g. nanowire growth, a catalyst needs to be deposited onto the drain contact, step 111. Furthermore, the requirement of catalyst particles also depends on the technique used to form the nanostructure, e.g. nanowire.

In a next step 112, a nanostructure, e.g. a nanowire is grown, e.g. by means of a VLS (Vapor-Liquid-Solid) process, but also any other suitable technique known by a person skilled in the art may be used to form the nanostructure, e.g. nanowire according to embodiments of the disclosure. For example, the nanostructure, e.g. nanowire may be grown using techniques such as CVD (Chemical Vapor Deposition), MO-CVD (Metal Organic Chemical Vapor Deposition), or PECVD (plasma enhanced chemical vapor deposition) processes. Alternatively, also PLD (Pulsed Laser Deposition), ECD (Electrochemical Deposition), e-beam or MBE (Molecular Beam Epitaxy) processes may be used to grow the nanostructure, e.g. nanowire.

During growth of the nanostructure, e.g. nanowire, different regions with different doping levels and different doping types need to be created to form the drain region 6, the channel region 5, the source region 2 and the transition layer 7 of the nanostructure, e.g. nanowire. The different regions in the nanostructure, e.g. nanowire, can be doped during the growth process to obtain an n-type or p-type region. Alternatively, the doping of the different regions of the nanostructure, e.g. nanowire may be performed after growth of these regions by means of an additional doping step. The doping in one specific region, e.g. source region/drain region may for example be uniform, but may alternatively also have a non-uniform doping profile.

During growth of the nanostructure, e.g. nanowire, first a drain region 6 may be created. The drain region 6 may be made of a first semiconductor material which is highly n doped in case of a p-type NW-TFET, or alternatively in case of an n-type NW-TFET the drain region 6 is highly p doped. The doping level of the drain region 6 may be in the range of $10^{18}$/cc to $10^{21}$/cc, for example in the range of $10^{19}$/cc to $5.10^{20}$/cc.

Subsequently, the channel region 5 of the NW-TFET may be formed in the nanostructure, e.g. nanowire. The channel region 5 may for example be made of the first semiconductor material, although other suitable/compatible materials can be used. The channel region may for example be lowly doped, e.g. having a doping level below $10^{17}$ $cm^{-3}$ or undoped.

In a next step, a transition layer 7 may be formed onto (above) the channel region 5. The transition layer 7 may be made of a material which is al least partly identical to the source semiconductor material to be applied later, and at least partly different from the channel semiconductor material. The transition layer material 7 has lower diffusion kinetics for the dopant of the source region 2 to be formed than the channel material.

In a next step, a source region 2 may be created onto the transition layer 7. The source region 2 may be made of a second semiconductor material which is highly n doped in case of an n-type NW-TFET (or alternatively in case of an n-type NW-TFET the source region 2 is highly p doped). The doping level of the source region 2 may be in the range of $10^{18}$/cc to $10^{21}$/cc, for example in the range of $10^{19}$/cc to $5.10^{20}$/cc.

In a next step 113, 114, a gate structure 4a+4b may be formed onto the sidewalls of the nanostructure, e.g. nanowire, more specifically at least onto the sidewalls of the channel region 5 of the nanostructure, e.g. nanowire. The gate structure comprises a gate oxide 4a (also referred to as gate dielectric) and a gate electrode 4b (also referred to as gate contact). First the gate oxide 4a is formed and deposited directly onto the channel region 5 of the nanostructure, e.g. nanowire. In particular embodiments, the gate oxide 4a completely covers the outer sidewalls of the channel region 5. To obtain a complete coverage of the channel region 5, a small overlap of the gate oxide 4a with the highly-doped drain region 6 and/or source region 2 may be desirable.

Onto the gate dielectric 4a, e.g. gate oxide, a gate contact 4b (electrode) is deposited, step 114. The gate contact 4b may for example cover the whole gate oxide 4a.

The gate dielectric 4a may for example be selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. In particular embodiments, the gate oxide 4a may be a high-k oxide such as hafnium oxide. The thickness of the gate oxide may for example be in the range of 0.5 nm to 20 nm.

The gate contact 4b may for example be made of a conductive material, for example selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular embodiments, the gate contact 4b may be made of a metal of which the workfunction has been engineered specifically for the chosen nanostructure, e.g. nanowire material, the gate oxide material and gate oxide thickness.

Finally, as illustrated in step 115, an electrical contact 1 may be formed on the source region 2 (situated on top of the nanostructure, e.g. nanowire). The electrical contact 1 may for example be made of a conductive material which is selected from at least one of a silicide containing structure (NiSi, $CoSi_2$, $TiSi_2$, ... ), a germanide containing structure, a metal containing structure, poly silicon or a combination thereof. In particular embodiments, the electrical contact may be made of a combination of a metal with a silicide.

In case the nanostructure, e.g. nanowire, in particular the source and drain thereof, is not doped during the growth process, an extra doping step may be advantageous. For example, implantation of dopant elements followed by activation of the dopant elements by e.g. annealing can be applied to achieve n-type or p-type region in the nanostructure, e.g. nanowire. Alternatively, a layer, which is also referred to as dopant layer and which comprises dopant elements can be deposited or a dopant metal can be selectively deposited, e.g. with electrochemical deposition, onto the nanostructure, e.g. nanowire regions (not shown). An anneal step may then be applied so as to incorporate the dopant into the nanostructure, e.g. nanowire region, resulting in an n-type or p-type region.

It is to be understood that although particular embodiments, specific constructions and configurations, as well as materials, have been discussed herein for devices according to the present disclosure, various changes or modifications in form and detail may be made without departing from the scope of this disclosure as defined by the appended claims.

What is claimed is:

1. A tunnel field effect transistor comprising:
   a doped drain region comprising a drain semiconductor material;
   a channel region situated on the doped drain region, the channel region comprising a lowly doped channel semiconductor material or an undoped channel semiconductor material;
   a doped source region on the channel region, the doped source region comprising a source semiconductor material and a dopant; and
   a transition layer situated between the channel region and the doped source region, wherein the transition layer comprises a material which is at least partly identical to the source semiconductor material and which is at least partly different from the channel semiconductor material, and wherein the transition layer has lower diffusion kinetics for the dopant of the source region than does the channel semiconductor material, such that the tunnel field effect transistor comprises a hetero-junction.

2. The tunnel field effect transistor of claim 1, wherein the tunnel field effect transistor is a segmented vertical nanostructure having a diameter of from 1 nm to 500 nm and a length of from 5 nm to 2 μm.

3. The tunnel field effect transistor of claim 1, wherein the transition layer has a thickness of not more than 10 nm.

4. The tunnel field effect transistor of claim 1, wherein the doped drain region, the channel region, and the doped source region comprise a source-channel-drain structure, and wherein the source-channel-drain structure lies in a longitudinal direction of the tunnel field effect transistor, wherein a gate dielectric and a gate electrode are provided on the source-channel-drain structure, wherein the gate dielectric covers, along the longitudinal direction, at least part of the source-channel-drain structure, wherein the gate electrode is situated on the gate dielectric, but not extending beyond the gate dielectric.

5. The tunnel field effect transistor of claim 1, wherein the transition layer comprises the source semiconductor material or a combination of the source semiconductor material and the channel semiconductor material.

6. The tunnel field effect transistor of claim 1, further comprising at least one source contact on the at least one source region.

7. The tunnel field effect transistor of claim 1, wherein at least one of the doped source region and the doped drain region have a dopant concentration of from $10^{18}$/cc to $10^{21}$/cc.

8. The tunnel field effect transistor of claim 1, wherein at least one of the drain semiconductor material, the channel semiconductor material, or the source semiconductor material comprises at least one semiconductor material selected from the group consisting of group IV materials, binary compounds of group IV materials, group III/V materials, binary compounds of group III/V materials, tertiary compounds of group III/V materials, quaternary compounds of group III/V materials, group II/VI materials and binary compounds of group II/VI materials, tertiary compounds of group II/VI materials, and quaternary compounds of group II/VI materials.

9. The tunnel field effect transistor of claim 1, wherein the source semiconductor material comprises germanium or $Si_{(1-x)}Ge_x$ with x>0.15.

10. The tunnel field effect transistor of claim 1, wherein the channel semiconductor material comprises silicon.

11. The tunnel field effect transistor of claim 1, wherein the transition layer contains carbon at a concentration of up to 3%.

12. The tunnel field effect transistor of claim 1, wherein the transition layer is SiGe with 15% Ge, and wherein the transition layer is configured to contain out-diffusion of dopants to a distance of from 1 to 10 nm.

13. The tunnel field effect transistor of claim 1, wherein the transition layer is configured to preserve all of the dopant of the doped source region entirely within the doped source region and the transition layer.

14. The tunnel field effect transistor of claim 1, wherein the transition layer is configured to prevent diffusion of the dopant of the doped source region into the channel region.

15. The tunnel field effect transistor of claim 1, wherein the transition layer is configured to retard diffusion of the dopant of the doped source region into the channel region.

16. The tunnel field effect transistor of claim 1, wherein the transition layer has a thickness of from 1 nm to 10 nm.

17. The tunnel field effect transistor of claim 1, wherein the transition layer has a thickness of from 2 nm to 5 nm.

18. The tunnel field effect transistor of claim 17, wherein the transition layer is configured to prevent out-diffusion of dopants to not more than the thickness of the transition layer.

19. The tunnel field effect transistor of claim 1, wherein the doped source region is a highly doped Ge or a highly doped SiGe, wherein the channel region is undoped Si, wherein the dopant is B atoms, and wherein a whole doping is contained within the doped source region and the transition layer.

20. The tunnel field effect transistor of claim 1, wherein the transition layer is situated at an interface of the doped source region and the channel region, wherein the doped source region has a doping level of at least $10^{18}$ cm$^{-3}$ and wherein the channel region has a doping level of below $10^{17}$ cm$^{-3}$.

* * * * *